United States Patent
Saeki

(10) Patent No.: US 8,484,820 B2
(45) Date of Patent: Jul. 16, 2013

(54) SEMICONDUCTOR DEVICE FABRICATING METHOD AND FABRICATING APPARATUS

(75) Inventor: Yoshihiro Saeki, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/067,804

(22) Filed: Jun. 28, 2011

(65) Prior Publication Data

US 2011/0258849 A1    Oct. 27, 2011

Related U.S. Application Data

(62) Division of application No. 12/314,117, filed on Dec. 4, 2008, now Pat. No. 8,003,437.

(30) Foreign Application Priority Data

Dec. 13, 2007   (JP) ................. 2007-322099

(51) Int. Cl.
*B25B 11/00* (2006.01)
*B25B 1/00* (2006.01)
*B25B 27/14* (2006.01)
*B23Q 3/00* (2006.01)
*H01L 21/44* (2006.01)
*H01L 21/00* (2006.01)
*H01L 21/40* (2006.01)

(52) U.S. Cl.
USPC ........... 29/281.1; 269/21; 269/20; 269/289 R; 438/610; 438/110; 438/106; 257/778

(58) Field of Classification Search
USPC .. 269/21, 20, 289 R, 900, 903; 438/610–618, 438/106–120; 29/281.1; 257/778
See application file for complete search history.

(56) References Cited

U.S. PATENT DOCUMENTS

| | | | |
|---|---|---|---|
| 6,524,351 B2 * | 2/2003 | Ohta | ............................ 29/25.01 |
| 6,617,573 B2 | 9/2003 | Kawahashi | |
| 2003/0001286 A1 * | 1/2003 | Kajiwara et al. | .............. 257/778 |
| 2004/0001140 A1 | 1/2004 | Murayama | |

FOREIGN PATENT DOCUMENTS

| | | |
|---|---|---|
| JP | 63029539 | 2/1988 |
| JP | 7066268 | 3/1995 |
| JP | 8-213427 | 8/1996 |
| JP | 9-36181 | 2/1997 |
| JP | 11-307580 | 11/1999 |
| JP | 2001-68511 | 3/2001 |
| JP | 2002-313843 | 10/2002 |
| JP | 2005-347621 | 12/2005 |

\* cited by examiner

*Primary Examiner* — Monica Carter
*Assistant Examiner* — Nirvana Deonauth
(74) *Attorney, Agent, or Firm* — Rabin & Berdo, P.C.

(57) ABSTRACT

Respective attracting openings of a bonding head are disposed so as to avoid joining regions at which bump electrodes (obverse electrodes) of a semiconductor chip are joined with bump electrodes of a package substrate. Bump electrodes (reverse electrodes) that are connected to the bump electrodes are provided at a reverse side of the semiconductor chip at positions opposing the bump electrodes. Because the attracting openings do not overlap the joining regions, the bump electrodes (reverse electrodes) are not suctioned at the joining regions.

11 Claims, 11 Drawing Sheets

000# SEMICONDUCTOR DEVICE FABRICATING METHOD AND FABRICATING APPARATUS

CROSS-REFERENCE TO RELATED APPLICATION

This is a Divisional of U.S. application Ser. No. 12/314,117, filed Dec. 4, 2008, now U.S. Pat. No. 8,003,437 and allowed on Mar. 31, 2011, the subject matter of which is incorporated herein by reference.

This application claims priority under 35 USC 119 from Japanese Patent Application No. 2007-322099, the disclosure of which is incorporated by reference herein.

BACKGROUND OF THE INVENTION

1. Field of the Invention

The present invention relates to a semiconductor device fabricating method and fabricating apparatus. In particular, the present invention relates to a semiconductor device fabricating method and fabricating apparatus that include a process of picking-up and conveying a semiconductor chip, and flip-chip connecting obverse electrodes of the semiconductor chip to a package substrate.

2. Description of the Related Art

Semiconductor chips that have been separated into individual chips from a wafer are picked-up one-by-one and conveyed to a bonding device. Conventionally, when carrying out bonding by flip-chip connection, a bonding device having a bonding head that is generally called a collet is used. A single suction hole that passes-through the bonding head is provided in the bonding head. The reverse (rear surface) of the semiconductor chip is attracted to the attracting surface of the bonding head by suction from this suction hole. The semiconductor chip is attracted to the bonding head, and is conveyed to a position at which bump electrodes, that are provided at the obverse of the semiconductor chip, and bump electrodes of a package substrate oppose one another. Then, the bump electrodes that oppose one another are joined together by being heated while pressure is applied, or the like.

Various modified examples have been proposed for the configurations of the attracting surface and the attracting opening of the bonding head in order for the bonding head to function as a semiconductor chip attracting device and conveying device (Japanese Patent Applications Laid-Open (JP-A) Nos. 63-29539, 7-66268). For example, JP-A No. 63-29539 proposes providing a groove at the periphery of the attracting opening, in order to facilitate canceling of the state of holding by the attraction. Further, JP-A No. 7-66268 proposes an attracting device that attracts and holds a semiconductor chip via an attracting collet that has a chip contacting portion that contacts the semiconductor chip while avoiding a contact prohibited region.

Manufacturing techniques have recently been proposed that stack semiconductor chips in plural layers, such as the chip-on-chip technique and the chip stacking technique. In these structures, in order to stack semiconductor chips, bump electrodes are provided not only at the obverse side of the semiconductor chip, but at the reverse side as well. However, a conventional bonding device does not suppose the conveying of a semiconductor chip with electrodes at both sides at which bump electrodes are formed at the obverse and the reverse. Various problems have therefore arisen.

For example, a case in which a semiconductor chip 30 with electrodes at both sides is attracted and conveyed by a bonding head 100 as shown in FIG. 10A will be described. Bump electrodes 32 are provided on the obverse side of the semiconductor chip 30, and bump electrodes 34 are provided on the reverse side. The bump electrodes 32 and the bump electrodes 34 are electrically connected by pass-through electrodes 36 that pass-through the substrate of the semiconductor chip 30.

The region where the bump electrode 34 of the reverse side of the semiconductor chip 30 is provided is, as shown by the arrow, directly sucked by an attracting opening 104 of a pass-through hole 102 provided in the bonding head 100 as shown in FIG. 10B. Further, the region where the corresponding obverse side bump electrode 32 is provided also is sucked simultaneously via the substrate.

Due to the region where the obverse side bump electrode 32 is provided being sucked, the problem arises that the bump electrode 32 does not contact the bump electrode of the package substrate, and the opposing bump electrodes are not joined together well. Further, due to the bump electrode 32 that should be joined not being joined, and the like, stress differences arise within the semiconductor chip 30, and there are cases in which the semiconductor chip 30 breaks and bonding cannot be carried out. Moreover, due to the reverse side of the semiconductor chip 30 being locally sucked by the attracting opening 104, there are also cases in which the bump electrode 34 at the reverse side deforms, or stress concentrates at the portion along the outer periphery of the attracting opening 104 and the semiconductor chip 30 breaks, and bonding cannot be carried out.

The above-described problems appear markedly in particular due to (1) the semiconductor chip being made thin to a thickness of 50 µm or the like and (2) bump electrodes being disposed not only at the chip periphery but at the chip central portion as well, and the like, that, in addition to bump electrodes being formed on the obverse and the reverse of the semiconductor chip, have accompanied the recent trend toward higher integration.

SUMMARY OF THE INVENTION

The present invention was developed in view of the above-described problems, and an object thereof is to provide a semiconductor device fabricating method and fabricating apparatus that can prevent poor joining of bump electrodes when flip-chip connecting obverse electrodes of a semiconductor chip, at which electrodes are formed at the obverse and the reverse, to a package substrate.

In order to achieve the above-described object, in accordance with an aspect of the present invention, there is provided a method of fabricating a semiconductor device by mounting, on a substrate, a semiconductor chip that has obverse electrodes provided at an obverse side, and reverse electrodes provided at a reverse side so as to oppose the obverse electrodes and electrically connected to the obverse electrodes, the method including:

(a) selecting a plurality of attraction regions, at which a holding member is made to attract, from among regions of the reverse side other than regions at which are provided reverse electrodes that are electrically connected to obverse electrodes of the semiconductor chip that are to be joined to electrodes of the substrate;

(b) holding the semiconductor chip from the reverse side by causing the holding member to attract the plurality of attraction regions; and (c) joining obverse electrodes of the semiconductor chip and electrodes of the substrate by placing, on the substrate, the semiconductor chip that is held.

Further, the (c) joining of obverse electrodes of the semiconductor chip and electrodes of the substrate may include:

(c') joining the semiconductor chip and the substrate by moving the holding member and making positions of obverse electrodes of the semiconductor chip that is held and electrodes of the substrate coincide.

Further, in accordance with another aspect of the present invention, there is provided a method of fabricating a semiconductor device by forming a semiconductor chip that has obverse electrodes provided at an obverse side, and reverse electrodes provided at a reverse side so as to oppose the obverse electrodes and electrically connected to the obverse electrodes, and mounting the semiconductor chip on a substrate, the method including:

(e) forming reverse electrodes, that are connected to obverse electrodes of the semiconductor chip that are to be joined to electrodes of the substrate, at regions of the reverse side other than a plurality of attraction regions, at which a holding member, that holds the semiconductor chip from the reverse side, is made to attract;

(f) holding the semiconductor chip from the reverse side by causing the holding member to attract the plurality of attraction regions; and (g) joining the semiconductor chip and the substrate by moving the holding member and making positions of obverse electrodes of the semiconductor chip that is held and electrodes of the substrate coincide.

In the above described semiconductor device fabricating method, the plural attraction regions can be attraction regions that are circular, rectangular, or strip-shaped. Further, portions of or entireties of attraction regions that are strip-shaped may be connected together.

Further, the plurality of attraction regions are strip-shaped attraction regions, and portions of or entireties of the strip-shaped attraction regions may be connected together.

In the above-described semiconductor device fabricating apparatus, the holding member may have plural suction holes that pass-through the holding member, and the plural attracting openings may be provided as the openings of the plural suction holes. Or, the holding member may have plural suction holes that pass-through the holding member, and the plural suction holes may have groove portions that communicate with the suction holes respectively, and the plural attracting openings may be provided as the openings of the plural suction holes and groove portions. Or, the holding member may have a suction opening and plural groove portions that communicate with the suction opening and are provided at an attracting surface side that attracts the semiconductor chip, and the plural attracting openings may be provided as the openings of the plural groove portions.

The plural attracting openings that are formed in the holding member can be attracting openings that are circular, rectangular, or strip-shaped. Further, portions of or entireties of attracting openings that are strip-shaped may be connected together.

In accordance with the present invention, there is the effect that, in a case in which obverse electrodes of a semiconductor chip, at which electrodes are formed at the obverse and reverse, are flip-chip connected to a package substrate, poor joining of bump electrodes can be prevented.

BRIEF DESCRIPTION OF THE DRAWINGS

Preferred exemplary embodiments of the present invention will be described in detail based on the following figures, wherein.

DETAILED DESCRIPTION OF THE INVENTION

Examples of exemplary embodiments of the present invention will be described in detail hereinafter with reference to the drawings.

First Exemplary Embodiment

Bonding Device

Figure 1A:
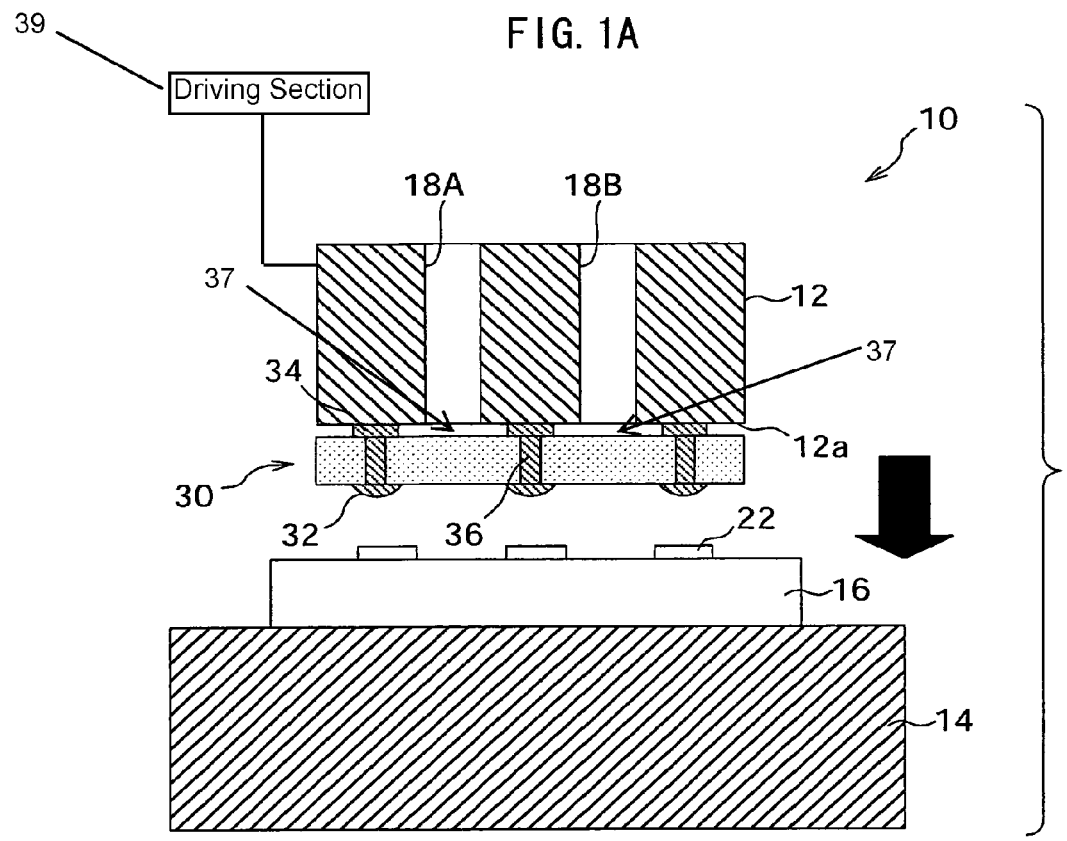
FIG. 1A is a schematic sectional view showing the structure of a bonding device relating to a first exemplary embodiment of a fabricating apparatus of the present invention.
Figure 1B:
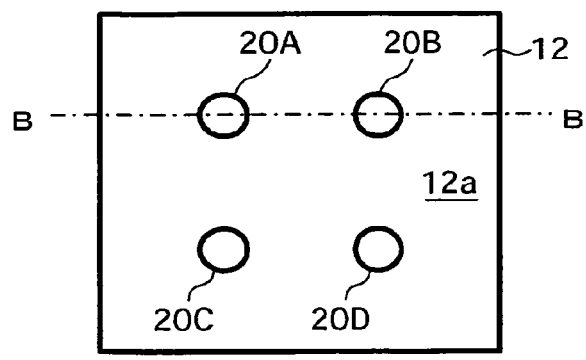
FIG. 1B is a plan view of an attracting surface of a bonding head of the bonding device relating to the first exemplary embodiment of the fabricating apparatus of the present invention.

FIG. 1A is a schematic sectional view showing the structure of a bonding device relating to a first exemplary embodiment of a fabricating apparatus of the present invention. FIG. 1B is a plan view of an attracting surface of a bonding head. FIG. 1A corresponds to a cross-sectional view along line B-B of FIG. 1B. A bonding head 12, that is parallelepiped and supported movably, and a stage 14, that holds a package substrate 16 at which plural bump electrodes 22 serving as substrate electrodes are formed, are provided at a bonding device 10. The bonding head 12 is driven by driving device (also referred to as a driving section) 39, and can move upward, downward, left and right within a predetermined range from the stage 14.

The bonding head 12 functions as a holding member that sucks and holds a semiconductor chip. Plural suction holes 18 that pass-through the bonding head 12 are provided at the bonding head 12. The plural suction holes 18 are connected to an unillustrated suction device such that they can be cut-off therefrom. Namely, the suction device can maintain and cancel the sucking state. Due to the suction from the suction holes 18, the reverse of a semiconductor chip 30 is attracted to an attracting surface 12a of the bonding head 12. The attracting surface 12a of the bonding head 12 is a flat surface that is rectangular in plan view, and is a size larger than the semiconductor chip 30.

Although only suction holes 18A, 18B are shown in the cross-sectional view shown in FIG. 1A, the substantially parallelepiped bonding head 12 has the four suction holes 18A through 18D as shown in FIG. 1B. The openings of these suction holes 18A through 18D at the attracting surface 12a side are respectively attracting openings 20A through 20D. The outer peripheral configurations of the respective attracting openings 20A through 20D are substantially circular. Note that, in cases in which there is no need to differentiate among the suction holes 18A through 18D, they are collectively referred to as the suction holes 18. In cases in which there is no need to differentiate among the attracting openings 20A through 20D, they are collectively referred to as the attracting openings 20.

The semiconductor chip 30 is a small, thin plate that is rectangular in plan view. Plural bump electrodes 32 serving as obverse electrodes are provided at the obverse side of the semiconductor chip 30. On the other hand, plural bump electrodes 34 serving as reverse electrodes are provided at the reverse side of the semiconductor chip 30, at positions opposing the plural bump electrodes 32. The bump electrode 32 and the bump electrode 34 that oppose one another are electrically connected by a pass-through electrode 36 that passes-through the substrate of the semiconductor chip 30. The respective attracting openings 20A through 20D of the bonding head 12 are disposed so as to avoid joining regions where the bump electrodes 32 of the semiconductor chip 30 are joined to the bump electrodes 22 of the package substrate 16. The conditions of the placement of the attracting openings 20 will be described later.

In the above-described bonding device 10, the semiconductor chip 30 is attracted to the attracting surface 12a by the suction from the attracting openings 20A through 20D of the bonding head 12. In this attracted state, the semiconductor chip 30 is conveyed to a position at which the bump electrodes 32 of the semiconductor chip 30 and the bump electrodes 22 of the package substrate 16 oppose one another. Thereafter, the bonding head 12 is moved in the direction of the arrow, and the bump electrodes 32 and the bump electrodes 22 are made to contact one another. At this time, by applying heat, load, ultrasonic waves, or the like to at least one of the bonding head 12 and the stage 14, the bump electrodes 32 and the bump electrodes 22 are joined. A semiconductor device at which the semiconductor chip 30 is mounted on the package substrate 16 is thereby fabricated.

<Arrangement of Attracting Openings>

The conditions of the arrangement of the attracting openings 20 of the bonding head 12 will be described hereinafter.

Figure 2A:
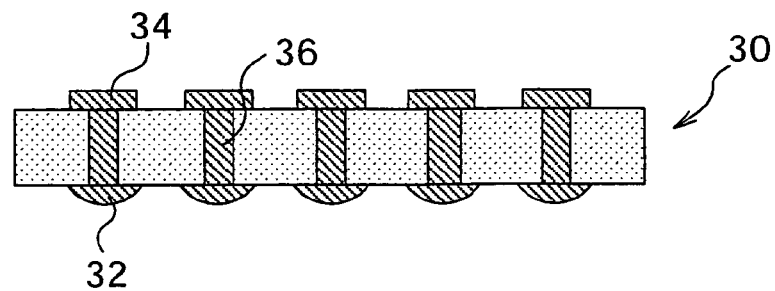
FIG. 2A is a cross-sectional view of a semiconductor chip at which bump electrodes are formed at the obverse and the reverse.
Figure 2B:
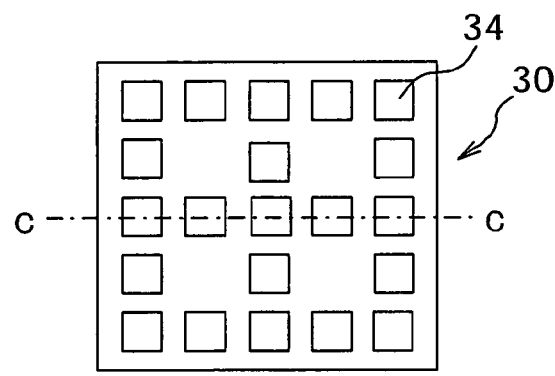
FIG. 2B is a plan view showing the arrangement of the bump electrodes at the reverse side.
Figure 2C:
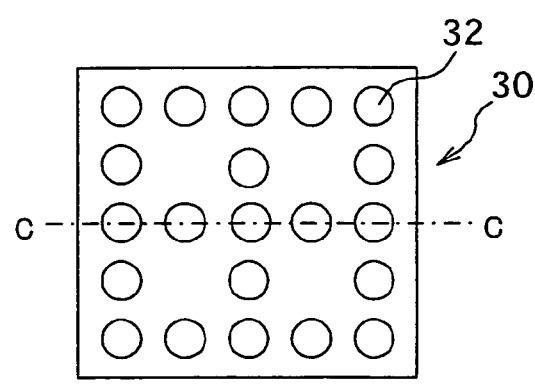
FIG. 2C is a plan view showing the arrangement of the bump electrodes at the obverse side.

First, the arrangement of the bump electrodes of the semiconductor chip will be described. FIG. 2A is a cross-sectional view of the semiconductor chip at which bump electrodes are formed at the obverse and the reverse. FIG. 2B is a plan view showing the arrangement of the bump electrodes at the reverse side. FIG. 2C is a plan view showing the arrangement of the bump electrodes at the obverse side. FIG. 2A corresponds to a cross-sectional view along line C-C of FIG. 2B and FIG. 2C. In the drawings, the bump electrodes are differentiated by the bump electrodes at the reverse side being shown by quadrilaterals and the bump electrodes at the obverse side being shown by circles, but these marks are not intended to limit the shapes of the bump electrodes.

The arrangement of the bump electrodes of the semiconductor chip is shown schematically in FIG. 2A through FIG. 2C. In actuality, an even larger number of bump electrodes are formed on the surfaces of the semiconductor chip 30. In the example shown in FIG. 2B, 21 of the bump electrodes 34 are formed on the reverse side of the semiconductor chip 30. These bump electrodes 34 are arranged in the form of a 5-line by 5-row matrix, except for four at the second line and second row, the second line and fourth row, the fourth line and second row, and the fourth line and fourth row.

Further, as shown in FIG. 2C, the bump electrodes 32 are provided at the obverse side of the semiconductor chip 30 at positions opposing the bump electrodes 34 via the substrate. Accordingly, basically, the number of the bump electrodes 32 and the number of the bump electrodes 34 are the same, and the arrangement of the bump electrodes 32 is a reflection of the arrangement of the bump electrodes 34.

Figure 3A:
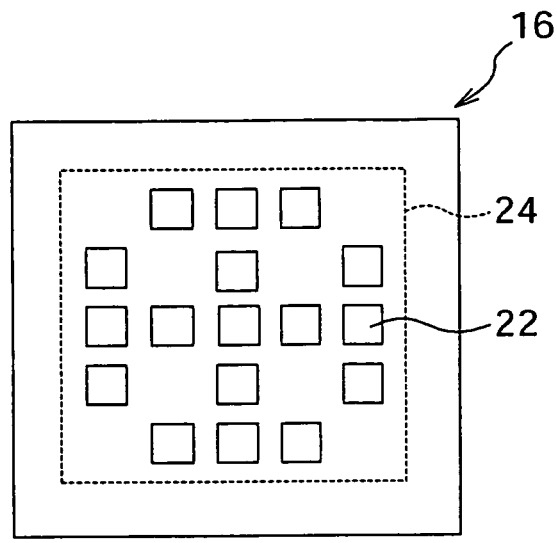
FIG. 3A is a plan view schematically showing the arrangement of bump electrodes of a package substrate.
Figure 3B:
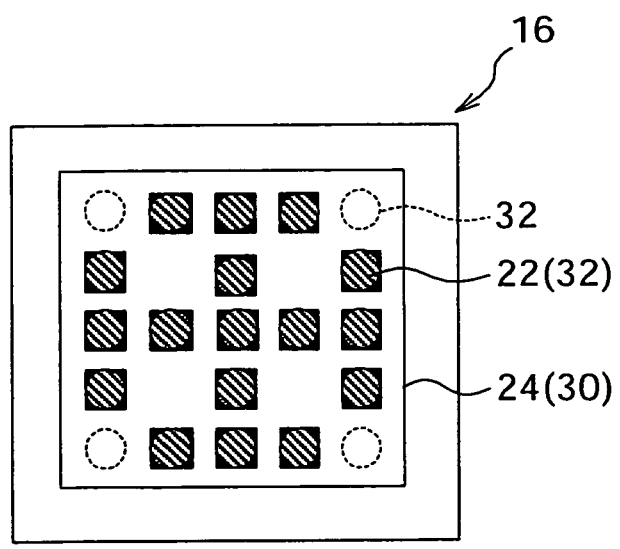
FIG. 3B is a plan view schematically showing joining regions where the bump electrodes are joined together.

Next, the joining regions where the bump electrodes are joined to one another will be described. FIG. 3A is a plan view schematically showing the arrangement of the bump electrodes of the package substrate, and FIG. 3B is a plan view schematically showing the joining regions where the bump electrodes are joined together. As shown in FIG. 3A, 17 of the bump electrodes 22 are formed at the obverse of the package substrate 16, within a region 24 that opposes the semiconductor chip 30. These bump electrodes 22 are arranged in the form of a 5-line by 5-row matrix, except for eight at the first line and first row, the first line and fifth row, the second line and second row, the second line and fourth row, the fourth line and second row, the fourth line and fourth row, the fifth line and first row, and the fifth line and fifth row.

When the semiconductor chip 30 is placed face-down on the package substrate 16 by the bonding head 12, as shown in FIG. 3B, the bump electrodes 32 and the bump electrodes 22 that oppose one another are joined. The regions where the bump electrodes 22 of the package substrate 16 and the bump electrodes 32 of the semiconductor chip 30 are joined in this way are joining regions. For example, the bump electrodes 32 that are illustrated by hatching of the semiconductor chip 30 are joined to the bump electrodes 22 that are illustrated by being blacked-in of the package substrate 16. However, for the bump electrodes 32 that are illustrated by the dashed lines of the semiconductor chip 30, bump electrodes do not exist at opposing positions, and therefore, these bump electrodes 32 are excluded from the joining regions.

The above-described placement information of the bump electrodes 32 (the obverse electrodes) of the semiconductor chip 30 and the placement information of the bump electrodes 22 (the substrate electrodes) of the package substrate 16 can be easily acquired from a design diagram of the semiconductor device, or the like. The joining regions are determined by comparing these, and the bonding head 12 is designed such that the attracting openings 20 are disposed to avoid these joining regions.

Figure 4:
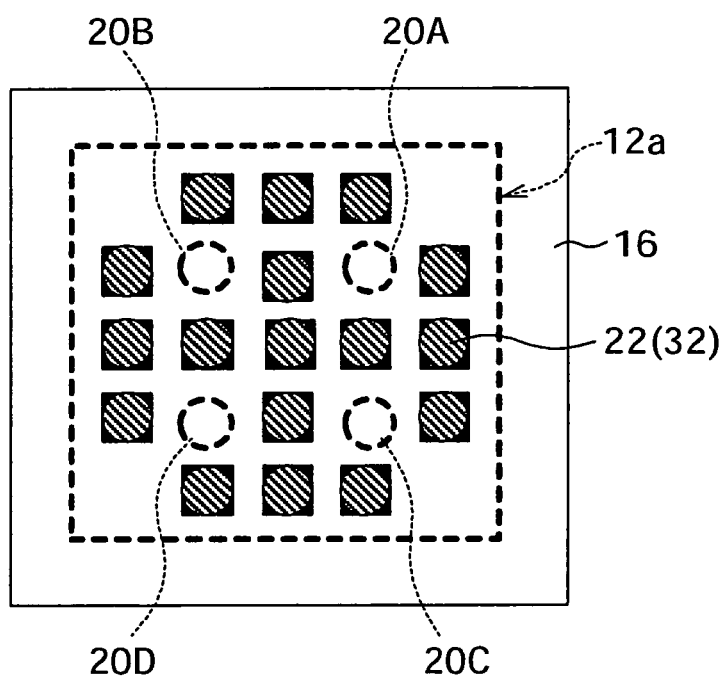
FIG. 4 is a drawing showing the layout of attracting openings corresponding to the joining regions.

FIG. 4 is a drawing showing the layout of the attracting openings that corresponds to the joining regions. For example, as shown in FIG. 4, the joining regions of the semiconductor chip 30 that is disposed on the package substrate 16 are assumed in advance, and the structure of the bonding head 12 can be designed such that, when the reverse of the semiconductor chip 30 is attracted to the attracting surface 12a of the bonding head 12, the plural attracting openings 20 are disposed so as to be scattered at the gaps between these joining regions. Note that the layout of the attracting openings 20 at the attracting surface 12a of the bonding head 12 is shown by the thick dashed lines. In FIG. 4, the attracting surface 12a is viewed from the reverse side.

The bonding head 12 shown in FIG. 1A and FIG. 1B is designed on the basis of the layout (FIG. 4) of the attracting openings 20 that corresponds to the joining regions shown in FIG. 3B, and has the four suction holes 18A through 18D that open at the attracting surface 12a respectively. The openings of the suction holes 18A through 18D are the attracting openings 20A through 20D, respectively. Accordingly, the attracting openings 20A through 20D do not overlap the joining regions.

The plural bump electrodes 34 (reverse electrodes) are provided at the reverse side of the semiconductor chip 30. At the joining regions, portions of these bump electrodes 34 are connected to the bump electrodes 22 (the substrate electrodes) of the package substrate 16 via the bump electrodes 32 (the obverse electrodes). Accordingly, the reverse side of the semiconductor chip 30 is sucked and held by the bonding head 12 such that the bump electrodes 34 (the reverse electrodes) that are connected to the bump electrodes 22 (the substrate electrodes) are not sucked. Namely, the "plurality of attraction regions" 37 are selected from regions of the reverse side that are other than the regions at which the reverse electrodes connected to the substrate electrodes are provided. These attraction regions 37 are attracted to the attracting openings 20 of the bonding head 12.

As described above, in the present exemplary embodiment, the obverse electrodes of the semiconductor chip, that are flip-chip connected to electrodes on a package substrate, and the corresponding reverse electrodes are not sucked at the time of bonding. Therefore, poor joining, such as electrodes that should be joined not being joined, or the like, can be prevented from arising, and further, deformation of the reverse electrodes due to suction also can be prevented. Moreover, in the present exemplary embodiment, because the semiconductor chip is attracted at the plural attracting openings, it is difficult for stress differences to arise within the semiconductor chip, and the semiconductor chip can be prevented from breaking.

Second Exemplary Embodiment

Figure 5A:
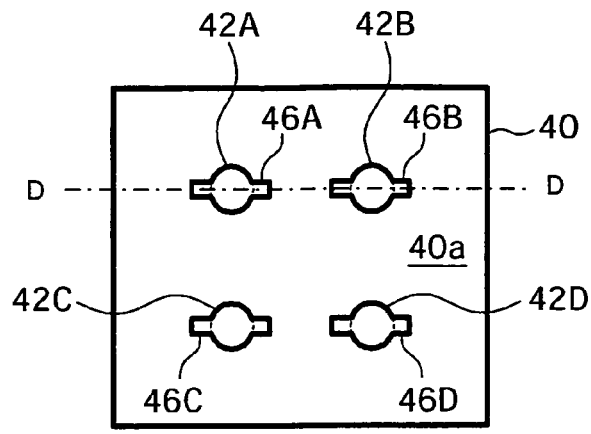
FIG. 5A is a plan view of an attracting surface of a bonding head.
Figure 5B:
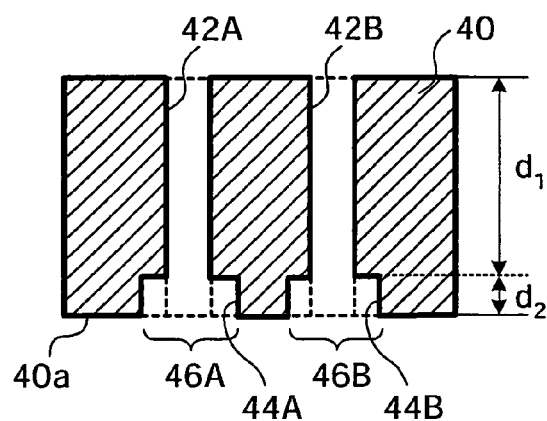
FIG. 5B is a cross-sectional view along line D-D of FIG. 5A.
Figure 5C:
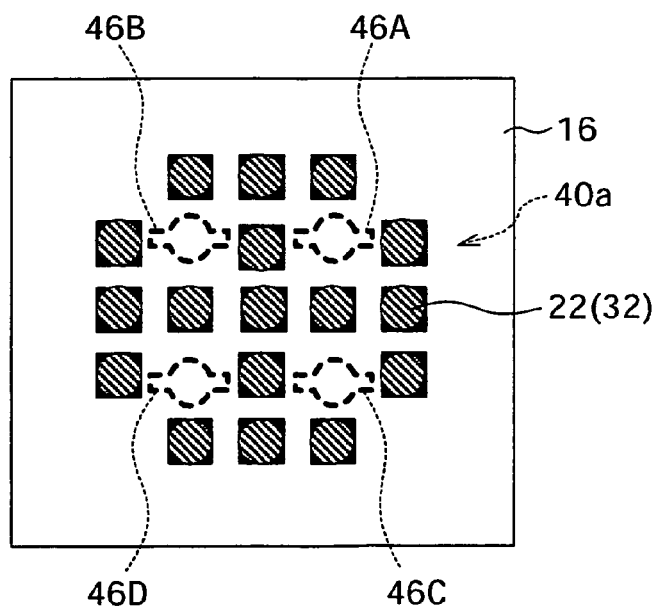
FIG. 5C is a drawing showing the layout of attracting openings corresponding to joining regions.

A bonding device relating to a second exemplary embodiment has a structure similar to that of the first exemplary embodiment, other than the structure of the bonding head. Therefore, description of the overall structure will be omitted, and only the structure of the bonding head will be described hereinafter. FIG. 5A is a plan view of an attracting surface of a bonding head, and FIG. 5B is a cross-sectional view along line D-D of FIG. 5A. Further, FIG. 5C is a drawing showing a layout of attracting openings that corresponds to the joining regions.

A bonding head 40 relating to the second exemplary embodiment has an attracting surface 40a that is rectangular in plan view. Plural suction holes 42 that pass-through the bonding head 40 are provided at the bonding head 40. Although only suction holes 42A, 42B are shown in the cross-sectional view of FIG. 5B, the bonding head 40 has the four suction holes 42A through 42D as shown in FIG. 5A. The suction holes 42A through 42D are respectively shaped as cylinders whose cross-sectional configurations are substantially circular.

On the other hand, plural grooves 44, that are cut-out at predetermined depths from the attracting surface 40a, are provided at the attracting surface 40a side. The groove widths of the grooves 44 are larger than the hole diameters of the suction holes 42, and are suitably about several times (e.g., about 200 μm) the pitch at which the bump electrodes are disposed (usually 50 μm). Further, depth d2 may be much smaller than depth d1. For example, the depth d1 can be made to be substantially equal to the height of the parallelepiped bonding head 12, whereas the depth d2 is suitably about 200 μm.

Although only grooves 44A, 44B are shown in the cross-sectional view of FIG. 5B, as shown in FIG. 5A, the four suction holes 42A through 42D open at the attracting surface 40a of the bonding head 40, and the grooves 44A through 44D are provided at these respective openings. The groove 44A is formed so as to communicate with the suction hole 42A, and extends outwardly from the suction hole 42A. In this example, the groove 44A that extends parallel to one end of the attracting surface 40a is formed. Similarly, the groove 44B is formed so as to communicate with the suction hole 42B and extend outwardly from the suction hole 42B. The groove 44C is formed so as to communicate with the suction hole 42C and extend outwardly from the suction hole 42C. The groove 44D is formed so as to communicate with the suction hole 42D and extend outwardly from the suction hole 42D.

The attracting surface 40a side openings of the suction hole 42A and the groove 44A are an attracting opening 46A. Similarly, the attracting surface 40a side openings of the suction hole 42B and the groove 44B are an attracting opening 46B. The attracting surface 40a side openings of the suction hole 42C and the groove 44C are an attracting opening 46C. The attracting surface 40a side openings of the suction hole 42D and the groove 44D are an attracting opening 46D. The configuration of each of the attracting openings 46A through 46D is a shape in which a rectangle is superposed on a circle. Note that, in cases in which there is no need to differentiate among the suction holes 42A through 42D, they are collectively called the suction holes 42. In cases in which there is no need to differentiate among the grooves 44A through 44D, they are collectively called the grooves 44. In cases in which there is no need to differentiate among the attracting openings 46A through 46D, they are collectively called the attracting openings 46.

At the above-described bonding device, the semiconductor chip 30 is attracted to the attracting surface 40a by the suction from the attracting openings 46A through 46D of the bonding head 40. In this attracted state, the semiconductor chip 30 is conveyed to the position at which the bump electrodes 32 of the semiconductor chip 30 and the bump electrodes 22 of the package substrate 16 oppose one another. Thereafter, the bonding head 40 is moved, and the bump electrodes 32 and the bump electrodes 22 are made to contact one another. The bump electrodes 32 and the bump electrodes 22 are joined by pressurizing, heating or the like by the bonding head.

In the present exemplary embodiment, in the same way as in the first exemplary embodiment, for the case of placing the semiconductor chip 30 face-down on the package substrate 16 and joining the bump electrodes 32 and the bump electrodes 22 that oppose one another, the same joining regions as in the first exemplary embodiment are supposed (FIG. 3B). The present exemplary embodiment shows another example of a layout of the attracting openings 46 which is such that the plural attracting openings 46 are disposed so as to be scattered in the gaps between the joining regions when the reverse of the semiconductor chip 30 is attracted to the attracting surface 40a of the bonding head 40.

Note that the layout of the attracting openings 46 is shown by the thick dashed lines. In FIG. 5C, the attracting surface 40a is viewed from the reverse side. The bonding head 40 relating to the second exemplary embodiment is designed on the basis of the layout (FIG. 5C) of the attracting openings 46 corresponding to the joining regions shown in FIG. 3B, and has the four attracting openings 46A through 46D that open at the attracting surface 40a respectively. Accordingly, the attracting openings 46A through 46D do not overlap the joining regions.

As described above, in the present exemplary embodiment, the obverse electrodes of the semiconductor chip, that are flip-chip connected to electrodes on a package substrate, and the corresponding reverse electrodes are not sucked at the time of bonding. Therefore, poor joining, such as electrodes that should be joined not being joined, or the like, can be prevented, and further, deformation of the reverse electrodes due to suction also can be prevented. Moreover, in the present exemplary embodiment, because the semiconductor chip is attracted at the plural attracting openings, it is difficult for stress differences to arise within the semiconductor chip, and the semiconductor chip can be prevented from breaking.

In addition, in the present exemplary embodiment, the surface area of attraction is increased by providing the grooves that are connected to the suction openings at the attracting surface side, and by making the shapes of the attracting openings be shapes in which a rectangle overlaps a circle. The attraction force can thereby be increased. Shifting of the position of the semiconductor chip due to load applied at the time of joining in the midst of the joining can be prevented.

Third Exemplary Embodiment

In the third exemplary embodiment, a bonding head is designed by assuming joining regions that are different than those in the first exemplary embodiment and the second exemplary embodiment. Further, a bonding device relating to the third exemplary embodiment has a structure similar to that of the first exemplary embodiment, other than the structure of the bonding head. Therefore, description of the overall structure will be omitted, and only the structure of the bonding head will be described hereinafter.

Figure 6:
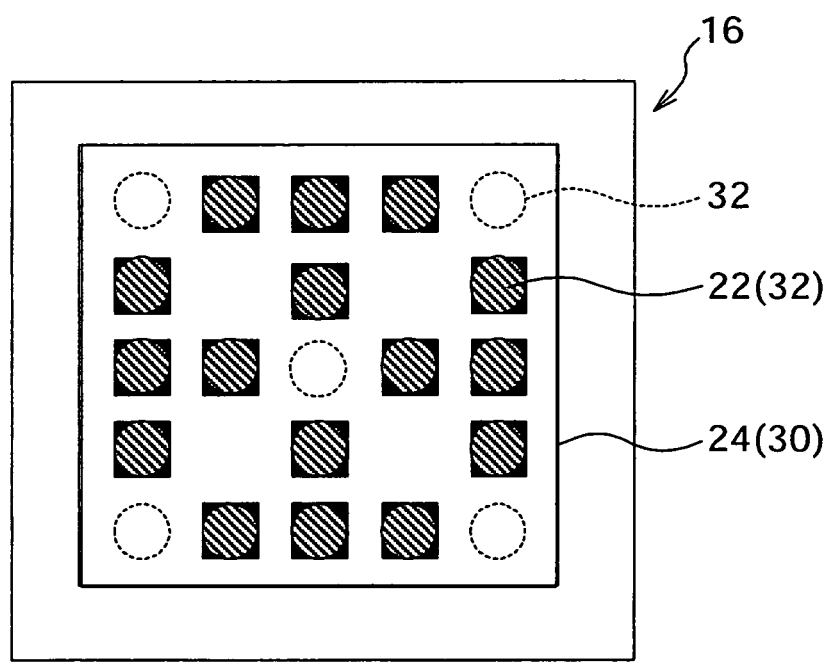
FIG. 6 is a plan view schematically showing the joining regions where the bump electrodes are joined together.

FIG. 6 is a plan view schematically showing joining regions at which the bump electrodes are joined to one another. The illustrated joining regions differ from the joining regions shown in FIG. 3B with regard to the point that a joining portion is not provided in the center of the matrix of five lines and five rows. A different layout of the attracting openings is possible when assuming the joining regions shown in FIG. 6 for a case in which the semiconductor chip 30 is placed face-down on the package substrate 16 and the bump electrodes 32 and the bump electrodes 22 that oppose one another are joined in the same way as in the first exemplary embodiment.

Figure 8:
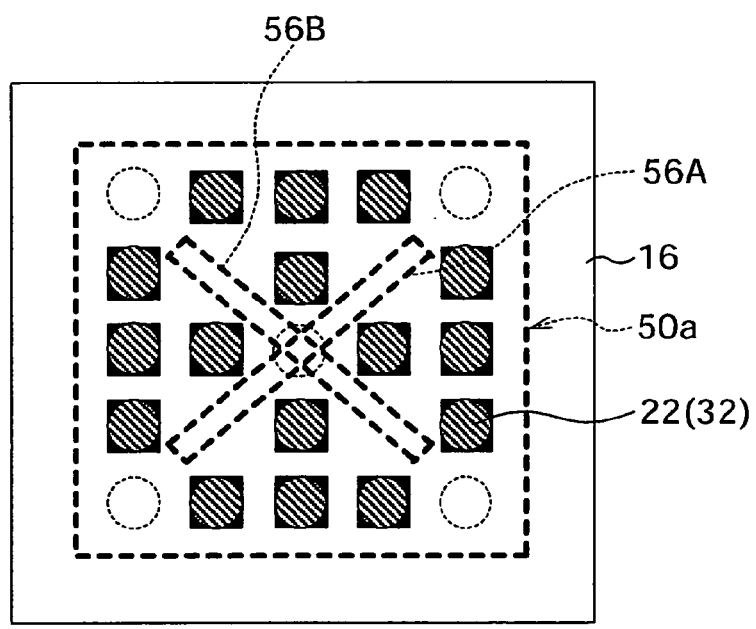
FIG. 8 is a drawing showing the layout of attracting openings corresponding to joining regions.

Namely, when assuming the joining regions shown in FIG. 6, the degrees of freedom in designing the bonding head increase. FIG. 8 is a drawing showing a layout of attracting openings corresponding to the joining regions. For example, as shown in FIG. 8, it is also possible to provide attracting openings that extend along the directions of the diagonal lines of an attracting surface 50a, while avoiding the joining regions shown in FIG. 6. Details will be described hereinafter.

Figure 7A:
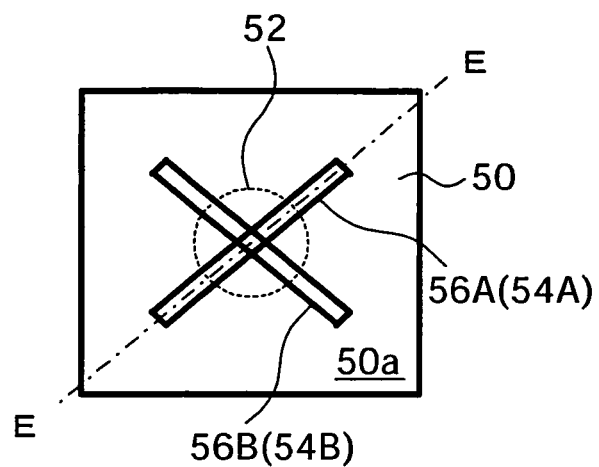
FIG. 7A is a plan view of an attracting surface of a bonding head.
Figure 7B:
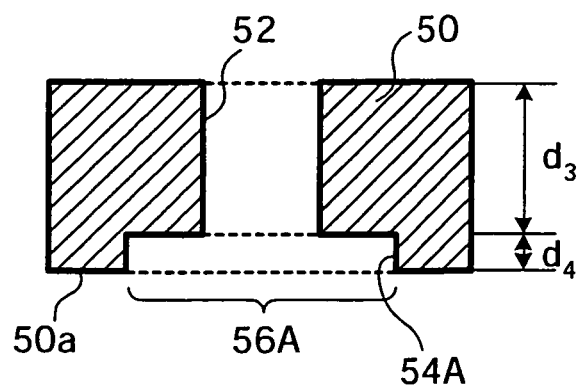
FIG. 7B is a cross-sectional view along line E-E of FIG. 7A.

FIG. 7A is a plan view of the attracting surface of the bonding head, and FIG. 7B is a cross-sectional view along line E-E of FIG. 7A. A bonding head 50 relating to the third exemplary embodiment has the attracting surface 50a that is rectangular in plan view. A suction hole 52, that is dug-out downward in the form of a cylinder to a depth d3 from the obverse at the opposite side of the attracting surface 50a, is provided in the bonding head 50. As shown in FIG. 7A, the suction hole 52 is shaped as a cylinder whose cross-sectional configuration is substantially circular.

On the other hand, plural grooves 54, that are cut-out at a predetermined depth d4 from the attracting surface 50a, are provided at the attracting surface 50a side. The groove widths of the grooves 54 are suitably about several times (e.g., about 200 μm) the pitch at which the bump electrodes are disposed (usually 50 μm). Further, the depth d4 may be much smaller than depth d3. The depth d3 can be made to be substantially equal to the height of the parallelepiped bonding head 12. In contrast, the depth d4 is suitably about 200 μm. Although only a groove 54A is shown in the cross-sectional view of FIG. 7B, as shown in FIG. 7A, the bonding head 50 has two grooves that are the groove 54A and a groove 54B. Both the groove 54A and the groove 54B are formed so as to communicate with the suction hole 52.

The attracting surface 50a side openings of the groove 54A and the groove 54B are respectively attracting openings 56A, 56B. The outer peripheral configurations of the attracting opening 56A and the attracting opening 56B respectively are shaped as strips whose long sides extend along the directions of the diagonal lines of the attracting surface 50a. The attracting opening 56A and the attracting opening 56B are disposed so as to intersect one another (intersect substantially orthogonally). Note that, in cases in which there is no need to differentiate between the groove 54A and the groove 54B, the are collectively referred to as the grooves 54. Further, in cases in which there is no need to differentiate between the attracting opening 56A and the attracting opening 56B, they are collectively called the attracting openings 56.

At the above-described bonding device, the semiconductor chip 30 is attracted to the attracting surface 50a by the suction from the attracting opening 56A and the attracting opening 56B of the bonding head 50. In this attracted state, the semiconductor chip 30 is conveyed to a position at which the bump electrodes 32 of the semiconductor chip 30 and the bump electrodes 22 of the package substrate 16 oppose one another. Thereafter, the bonding head 50 is moved, and the bump electrodes 32 and the bump electrodes 22 are made to contact each other. The bump electrodes 32 and the bump electrodes 22 are joined by pressurizing, heating or the like by the bonding head.

As described above, in the present exemplary embodiment, the obverse electrodes of the semiconductor chip, that are flip-chip connected to electrodes on a package substrate, and the corresponding reverse electrodes are not sucked at the time of bonding. Therefore, poor joining, such as electrodes that should be joined not being joined, or the like, can be prevented, and further, deformation of the reverse electrodes due to suction also can be prevented. Moreover, in the present exemplary embodiment, because the semiconductor chip is attracted at the plural attracting openings, it is difficult for stress differences to arise within the semiconductor chip, and the semiconductor chip can be prevented from breaking.

In addition, in the present exemplary embodiment, the attraction regions can be broadened by the attracting grooves that are provided at the attracting surface, without increasing the number of suction holes, and the heat distribution of the bonding head also is good. Further, shifting of the position of the semiconductor chip due to load applied at the time of joining in the midst of the joining can be prevented.

Fourth Exemplary Embodiment

In the fourth exemplary embodiment, the joining regions of the semiconductor chip are designed in accordance with the layout of the attracting openings of the bonding head, which is opposite to the first through third exemplary embodiments. Further, a bonding device that is used in the fourth exemplary embodiment has a structure similar to that of the first exemplary embodiment, other than the structure of the bonding head. Therefore, description of the overall structure will be omitted, and only the structure of the bonding head and the method of designing the joining regions will be described hereinafter.

Figure 9A:
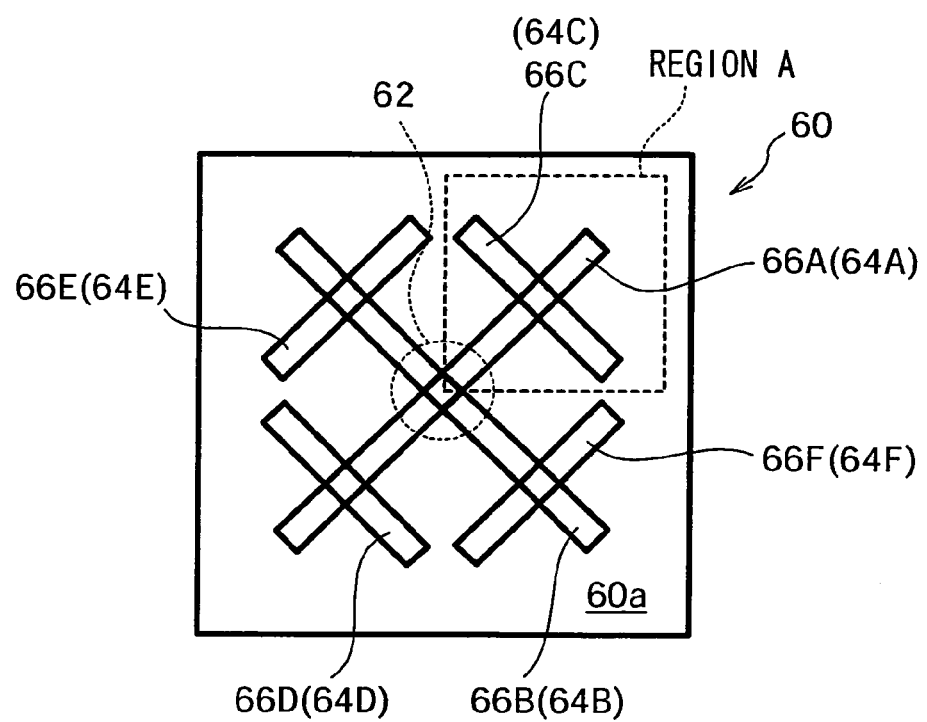
FIG. 9A is a plan view of an attracting surface of a bonding head.
Figure 9B:
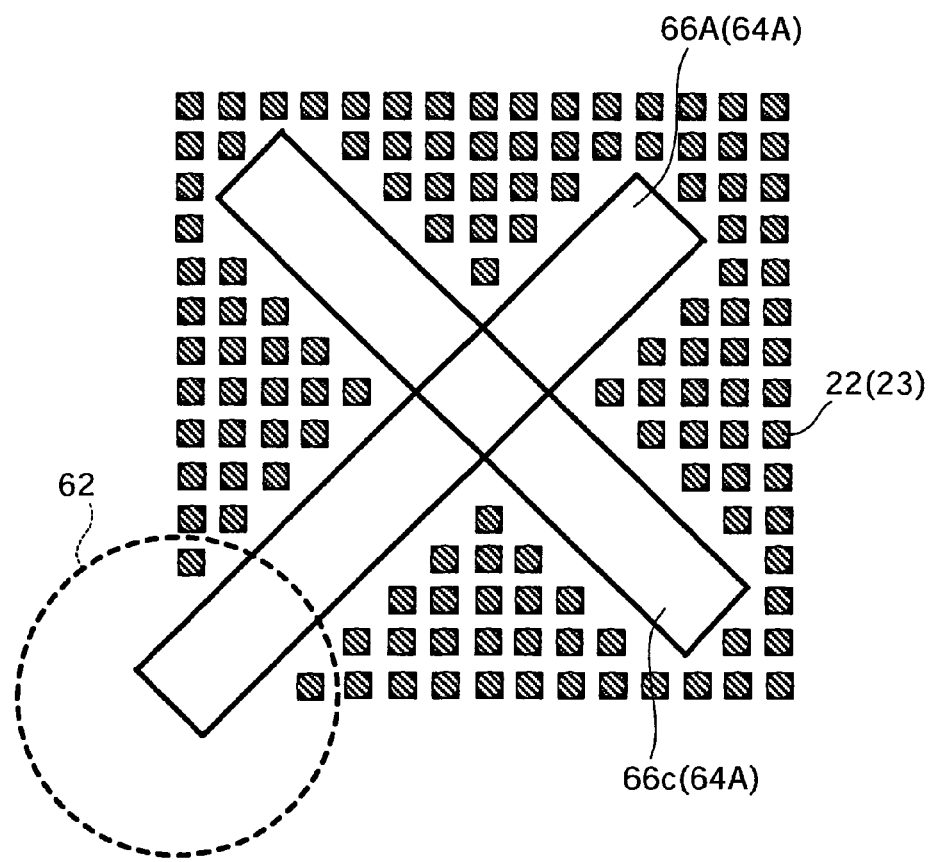
FIG. 9B is a partial enlarged view of region A of FIG. 9A.
Figure 10A:
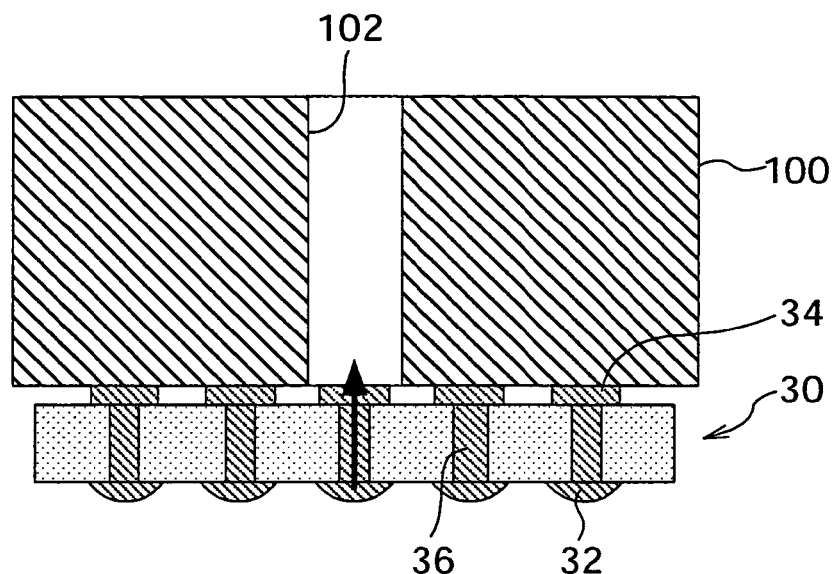
FIG. 10A is a diagram explaining problematic points of a conventional technique.
Figure 10B:
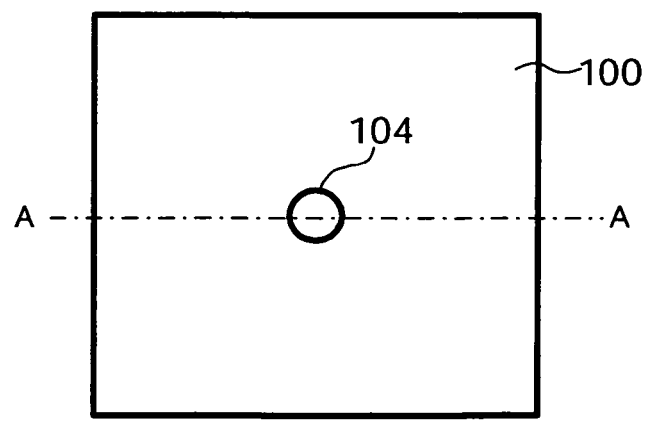
FIG. 10B is a diagram explaining the problematic points of the conventional technique.

FIG. 9A is a plan view of the attracting surface of the bonding head. FIG. 9B is a partial enlarged view of region A of FIG. 9A. A bonding head 60 relating to the fourth exemplary embodiment has an attracting surface 60*a* that is rectangular in plan view. A suction hole 62, that is dug-out downward in the form of a cylinder to a predetermined depth from the obverse at the opposite side of the attracting surface 60*a*, is provided in the bonding head 60. The suction hole 62 is shaped as a cylinder whose cross-sectional configuration is substantially circular.

On the other hand, plural grooves 64 that are cut-out at predetermined depths from the attracting surface 60*a*, are provided at the attracting surface 60*a* side. The groove widths of the grooves 64 are about several times the pitch at which the bump electrodes are disposed. For example, a groove width of about 200 μm is suitable. The groove depth of the grooves 64 is suitably about 200 μm for example. In this example, as shown in FIG. 9A, the bonding head 60 has six grooves 64A through 64F. The grooves 64A through 64F are respectively formed so as to communicate with the suction hole 62.

The attracting surface 60*a* side openings of the grooves 64A through 64F are respectively attracting openings 66A through 66F. The outer peripheral configurations of the attracting opening 66A and the attracting opening 66B respectively are shaped as strips whose long sides extend along the directions of the diagonal lines of the attracting surface 60*a*. The attracting opening 66A and the attracting opening 66B are disposed so as to intersect one another (intersect substantially orthogonally).

Further, the outer peripheral configurations of the respective attracting openings 66C through 66F are shaped as strips whose long sides extend along directions parallel to the diagonal lines of the attracting surface 60*a*. The attracting opening 66C and the attracting opening 66D are disposed so as to intersect (intersect substantially orthogonally) the attracting opening 66A. Further, the attracting opening 66E and the attracting opening 66F are disposed so as to intersect (intersect substantially orthogonally) the attracting opening 66B. Note that, in cases in which there is no need to differentiate among the grooves 64A through 64F, they are collectively referred to as the grooves 64. Further, in cases in which there is no need to differentiate among the attracting openings 66A through 66F, they are collectively called the attracting openings 66.

As described above, the bump electrodes 32 of the semiconductor chip 30 and the bump electrodes 22 of the package substrate 16 are designed in advance and are disposed so as to be joined while avoiding the portions where the attracting openings 66A through 66F attract the semiconductor chip 30. For example, as shown in FIG. 9B, in region A, the joining regions where the bump electrodes 32 and the bump electrodes 22 are joined are disposed at the peripheries of the attracting opening 66A and the attracting opening 66C so as to not overlap the attracting opening 66A and the attracting opening 66C. Accordingly, the joining regions are not sucked by the attracting openings 66A through 66F.

Namely, regions at the reverse side of the semiconductor chip 30 that are to be attracted by the attracting openings 66 of the bonding head 60 (attraction regions) are determined in advance, and the bump electrodes 34 (the reverse electrodes) that are connected to the bump electrodes 22 (the substrate electrodes) of the package substrate 16 are formed at regions of the reverse side other than the attraction regions.

At the above-described bonding device, the semiconductor chip 30 is attracted to the attracting surface 60*a* by the suction from the attracting openings 66A through 66F of the bonding head 60. In this attracted state, the semiconductor chip 30 is conveyed to a position at which the bump electrodes 32 of the semiconductor chip 30 and the bump electrodes 22 of the package substrate 16 oppose one another. Thereafter, the bonding head 60 is moved, and the bump electrodes 32 and the bump electrodes 22 are made to contact each other. The bump electrodes 32 and the bump electrodes 22 are joined by pressurizing, heating or the like by the bonding head.

As described above, in the present exemplary embodiment, the obverse electrodes of the semiconductor chip, that are flip-chip connected to electrodes on a package substrate, and the corresponding reverse electrodes are not sucked at the time of bonding. Therefore, poor joining, such as electrodes that should be joined not being joined, or the like, can be prevented, and further, deformation of the reverse electrodes due to suction also can be prevented. Moreover, in the present exemplary embodiment, because the semiconductor chip is attracted at the plural attracting openings, it is difficult for stress differences to arise within the semiconductor chip, and the semiconductor chip can be prevented from breaking.

Moreover, in the present exemplary embodiment, the joining regions of the semiconductor chip are designed in accordance with the layout of the attracting openings of the bonding head. Therefore, by broadening the attracting grooves to the periphery of the semiconductor chip, it becomes possible to attract the entire semiconductor chip. Due thereto, it is more difficult for stress differences to arise within the semiconductor chip. Further, shifting of the position of the semiconductor chip due to load applied at the time of joining in the midst of the joining can be prevented. In addition, the attraction regions can be broadened without increasing the number of suction holes, and the heat distribution of the bonding head also is good.

What is claimed is:

1. An apparatus for fabricating a semiconductor device by mounting, on a substrate having electrodes, a semiconductor chip that has obverse electrodes provided at an obverse side of the semiconductor chip, and reverse electrodes provided at a reverse side of the semiconductor chip so as to oppose the obverse electrodes, the reverse electrodes being electrically connected to the obverse electrodes, the obverse electrodes and the reverse electrodes sandwiching the semiconductor chip therebetween, the obverse electrodes to be joined to the electrodes of the substrate, the apparatus comprising:

a holding member at which a plurality of attracting openings are formed so as to attract a plurality of attraction regions to hold the semiconductor chip from the reverse side, wherein the attraction regions exist at regions of the reverse side other than regions at which are provided any of the reverse electrodes; and a driving section driving the holding member, that is holding the semiconductor chip at the attraction regions, so as to make positions of the obverse electrodes and the electrodes of the substrate coincide such that the semiconductor chip and the substrate are joined together.

2. The apparatus of claim 1, wherein the holding member has a plurality of suction holes that pass-through the holding member, and the plurality of attracting openings are provided as openings of the plurality of suction holes.

3. The apparatus of claim 1, wherein the holding member has a plurality of suction holes that pass-through the holding member, and each of the plurality of suction holes communicates with a groove portion formed in the holding member, and the plurality of attracting openings are provided as openings of the plurality of suction holes and the groove portions.

4. The apparatus of claim 1, wherein the holding member has a suction opening and a plurality of groove portions that communicate with the suction opening and are provided at an attracting surface side of the holding member that attracts the semiconductor chip, and the plurality of the attracting openings are provided as openings of the plurality of groove portions.

5. The apparatus of claim 1, wherein the plurality of attracting openings each open in a circular, rectangular, or strip shape.

6. The apparatus of claim 1, wherein the plurality of attracting openings open in strip shapes, and portions or entireties of the strip-shaped attracting openings are connected together.

7. The apparatus of claim 1, wherein one of the obverse electrodes, the semiconductor chip, one of the reverse electrodes and the holding member are disposed in that stated order on a straight line.

8. The apparatus of claim 7, wherein the straight line is perpendicular to a surface of the obverse side and to a surface of the reverse side.

9. An apparatus for fabricating a semiconductor device, comprising:
a substrate having substrate electrodes;
a semiconductor chip having an obverse side and a reverse side opposite the obverse side, the semiconductor chip including obverse electrodes provided at the obverse side and reverse electrodes provided at the reverse side so as to oppose the obverse electrodes, the reverse electrodes being electrically connected to the obverse electrodes,
wherein the obverse electrodes and the reverse electrodes sandwich the semiconductor chip therebetween,
further wherein the semiconductor chip has attraction regions disposed at regions of the reverse side that are free of all of the reverse electrodes;
a holding member having a plurality of attracting openings that are disposed so as to attract the attraction regions and hold the semiconductor chip from the reverse side; and
a driving section driving the holding member while the holding member holds the semiconductor chip at the attraction regions so as to make positions of obverse electrodes and the substrate electrodes coincide so that the semiconductor chip and the substrate are joined together.

10. The apparatus of claim 9, wherein one of the obverse electrodes, the semiconductor chip, one of the reverse electrodes and the holding member are disposed in that stated order on a straight line.

11. The apparatus of claim 10, wherein the straight line is perpendicular to a surface of the obverse side and to a surface of the reverse side.

* * * * *